United States Patent
Naganuma

(10) Patent No.: US 8,334,463 B2
(45) Date of Patent: Dec. 18, 2012

(54) WIRING BOARD AND METHOD FOR MANUFACTURING THE SAME

(75) Inventor: Nobuyuki Naganuma, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 144 days.

(21) Appl. No.: 12/795,737

(22) Filed: Jun. 8, 2010

(65) Prior Publication Data

US 2011/0100698 A1    May 5, 2011

Related U.S. Application Data

(60) Provisional application No. 61/256,374, filed on Oct. 30, 2009.

(51) Int. Cl.
*H05K 1/03* (2006.01)

(52) U.S. Cl. .................. 174/255; 174/254; 174/262

(58) Field of Classification Search .............. 361/760, 361/792–795
See application file for complete search history.

(56) References Cited

U.S. PATENT DOCUMENTS

| | | | |
|---|---|---|---|
| 6,281,446 B1 | 8/2001 | Sakamoto et al. | |
| 7,525,814 B2 * | 4/2009 | Yuri et al. | 361/761 |
| 7,808,799 B2 * | 10/2010 | Kawabe et al. | 361/765 |
| 2002/0020554 A1 | 2/2002 | Sakamoto et al. | |
| 2005/0061544 A1 | 3/2005 | Nakakuki | |

FOREIGN PATENT DOCUMENTS

| | | |
|---|---|---|
| JP | 8-97564 | 4/1996 |
| JP | 10-284632 | 10/1998 |
| JP | 11-317582 | 11/1999 |
| JP | 2003-298234 | 10/2003 |
| JP | 2004-87786 | 3/2004 |
| JP | 2005-93811 | 4/2005 |
| JP | 2006-140213 | 6/2006 |
| TW | 200847363 | 12/2008 |
| WO | WO 2008/050399 A1 | 5/2008 |
| WO | WO 2011/003123 A1 | 1/2011 |

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

A wiring board has a first rigid wiring board having a substrate with a penetrating hole, a first insulation layer formed on the substrate to cover at least one opening of the penetrating hole, and a first wiring layer formed on the first insulation layer, a second rigid wiring board having a second wiring layer on a main surface and being accommodated in the penetrating hole, a first connection conductor which connects the first wiring layer and the second wiring layer, and a first interlayer insulation layer formed on the first wiring layer.

9 Claims, 18 Drawing Sheets

WIRING BOARD AND METHOD FOR MANUFACTURING THE SAME

CROSS-REFERENCE TO RELATED APPLICATIONS

The present application claims the benefits of priority to U.S. Application No. 61/256,374, filed Oct. 30, 2009. The contents of that application are incorporated herein by reference in their entirety.

BACKGROUND OF THE INVENTION

1. Field of the Invention

The present invention relates to a wiring board and its manufacturing method.

2. Discussion of the Background

In Japanese Laid-Open Patent Publication 2003-298234, a multilayer wiring board partially having a region with high wiring density is described. In such a wiring board, a second wiring board is adhered on a first wiring board, and the wiring of the first wiring board and the wiring of the second wiring board are electrically connected. The contents of Japanese Laid-Open Patent Application 2003-298234 are incorporated herein by reference in their entirety in the present application.

SUMMARY OF THE INVENTION

A wiring board according to one aspect of the present invention has a first rigid wiring board having a substrate with a penetrating hole, a first insulation layer formed on the substrate to cover at least one opening of the penetrating hole, and a first wiring layer formed on the first insulation layer, a second rigid wiring board having a second wiring layer on a surface and being accommodated in the penetrating hole, a first connection conductor which connects the first wiring layer and the second wiring layer, and a first interlayer insulation layer formed on the first wiring layer.

A method for manufacturing a wiring board according to another aspect of the present invention includes providing a first rigid wiring board comprising a substrate having an accommodation portion, providing a second rigid wiring board having a second wiring layer on a surface of the second wiring layer, positioning the second rigid wiring board in the accommodation portion of the first rigid wiring board, forming an insulation layer on the substrate of the first rigid wiring board and the second rigid wiring board positioned in the accommodation portion of the first rigid wiring board, forming a first via hole in the insulation layer, forming a first connection conductor in the first via hole, and forming a first wiring layer on the insulation layer such that the first wiring layer and the second wiring layer of the second rigid wiring board are electrically connected by the first connection conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
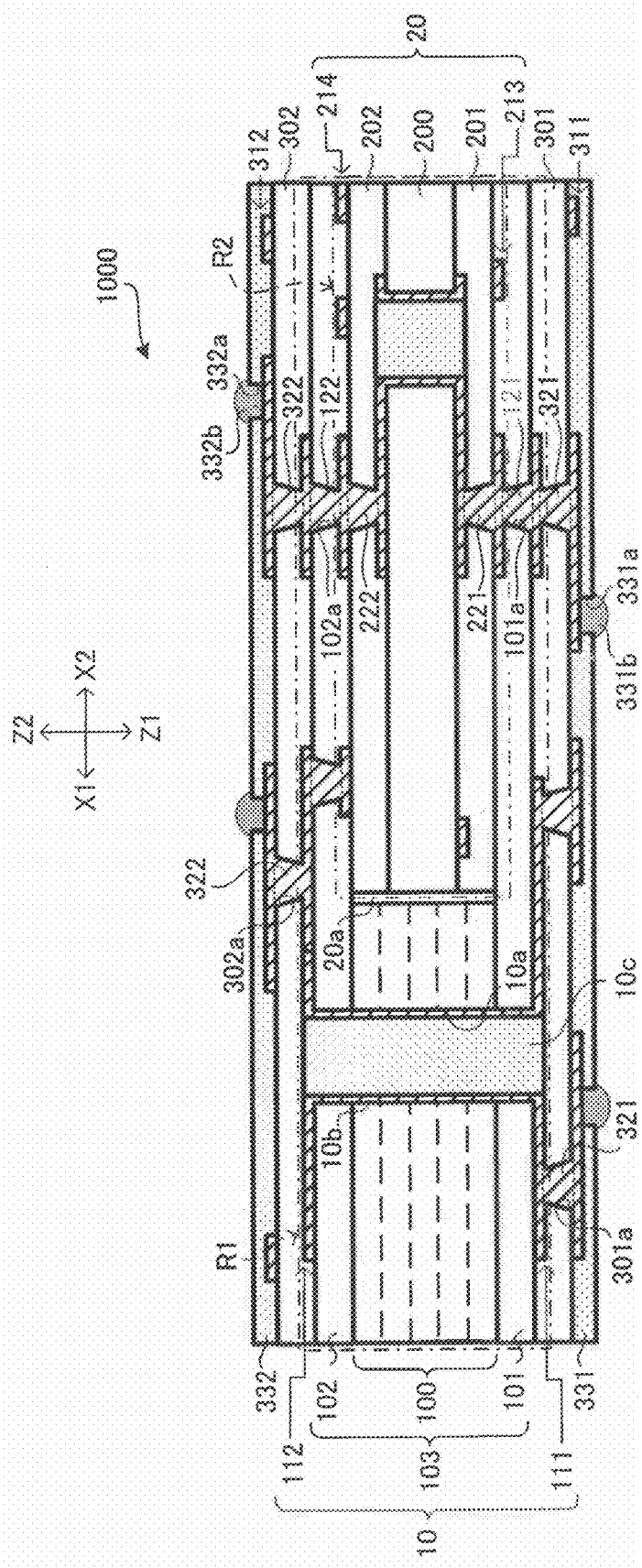
FIG. 1 is a cross-sectional view showing a schematic structure of a wiring board relating to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

In the description of an embodiment, two main surfaces facing opposite normal lines are referred to as a first surface (the surface on the arrow-Z1 side) and a second surface (the surface on the arrow-Z2 side). In the lamination directions, a side closer to the core is referred to as a lower layer (or an inner-layer side) and a side farther from the core is referred to as an upper layer (or an outer-layer side). An outer layer indicates a layer positioned uppermost (uppermost layer) and an inner layer indicates a layer positioned lower than the outer layer (a layer other than the uppermost layer). A layer including a conductive pattern which functions as wiring for circuits or the like is referred to as a wiring layer. A wiring layer may include a through-hole conductor or a land of a via conductor other than a conductive pattern described above. A conductor which is formed in a through hole and electrically connects wiring layers on both surfaces of a substrate to each other is referred to as a through-hole conductor. A conductor which is formed in a via hole and electrically connects an upper-layer wiring layer and a lower-layer wiring layer to each other is referred to as a via conductor.

As shown in FIG. 1, wiring board 1000 of the present embodiment has lower-density conductive region (R1) and higher-density conductive region (R2). The conductor density of higher-density conductive region (R2) is greater than that of lower-density conductive region (R1). If the number of wiring layers in terms of unit thickness is compared in lower-density conductive region (R1) and higher-density conductive region (R2), the number of wiring layers in higher-density conductive region (R2) is greater than the number of wiring layers in lower-density conductive region (R1). In the present embodiment, due to such a difference in the numbers of wiring layers, the existing density of conductors in higher-density conductive region (R2) is greater than the existing density of conductors in lower-density conductive region (R1).

Lower-density conductive region (R1) and higher-density conductive region (R2) are each part of first rigid wiring board 10. In addition, first rigid wiring board 10 has built-in second rigid wiring board 20. In first rigid wiring board 10, second rigid wiring board 20 corresponds to higher-density conductive region (R2), and the other area corresponds to lower-density conductive region (R1). Therefore, the existing density of conductors in second rigid wiring board 20 is greater than the existing density of conductors in first rigid wiring board 10. Wiring board 1000, first rigid wiring board 10 and second rigid wiring board 20 are each printed wiring boards.

Figure 2:
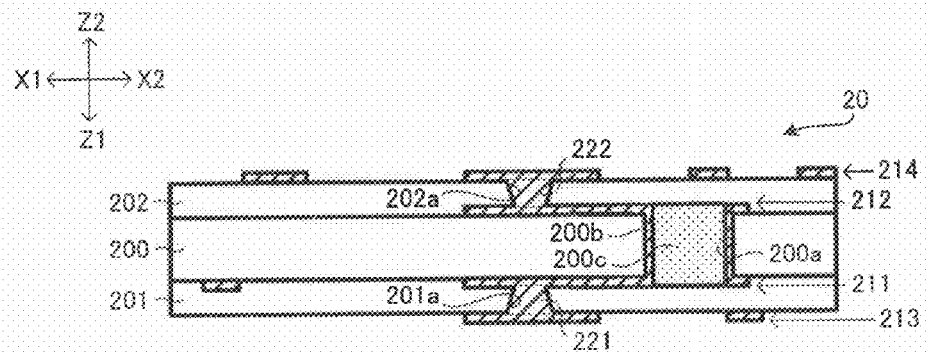
FIG. 2 is a cross-sectional view showing a schematic structure of a second rigid wiring board.

As shown in FIG. 2, second rigid wiring board 20 has substrate 200, insulation layers (201, 202), wiring layers (211-214) and via conductors (221, 222). Wiring layers (213, 214) are formed on the main surfaces (first surface, second surface) of second rigid wiring board 20. Via conductors (221, 222) are filled vias. Wiring layers (211-214) and via conductors (221, 222) are made of copper, for example. Also, insulation layers (201, 202) work as interlayer insulation layers. Insulation layers (201, 202) are made of cured prepreg, for example. As for prepreg, the following is used, for example: base material such as glass fiber or aramid fiber impregnated with resin such as epoxy resin, polyester resin, bismaleimide triazine resin (BT resin), imide resin (polyimide), phenol resin or allyl polyphenylene ether resin (A-PPE resin).

Substrate 200 is made of epoxy resin, for example. Epoxy resin is preferred to contain reinforcing material such as glass fiber or aramid fiber, impregnated with resin, for example. Reinforcing material is such material that has a smaller thermal expansion coefficient than the primary material (epoxy resin). As for reinforcing material, inorganic material, such as glass cloth, silica filler or glass filler, is preferred.

Wiring layer 211 is formed on the first surface of substrate 200, and wiring layer 212 is formed on the second surface of substrate 200. Through hole (200a) is formed in substrate 200. Then, on the wall surface of through hole (200a), through-hole conductor (200b) is formed. Through-hole conductor (200b) electrically connects wiring layer 211 and wiring layer 212 to each other. In through hole (200a), resin (200c) spilled out from insulation layers (201, 202), for example, is filled. The wiring board, which is formed with substrate 200, wiring layers (211, 212) and through-hole conductor (200b), corresponds to the core substrate of second rigid wiring board 20.

Insulation layer 201 is formed on the first surface of substrate 200, and insulation layer 202 is formed on the second surface of substrate 200. Wiring layer 213 is formed on insulation layer 201, and wiring layer 214 is formed on insulation layer 202. Via hole (201a) is formed in insulation layer 201, and via hole (202a) is formed in insulation layer 202. In via holes (201a, 202a), a conductor (such as copper) is filled through plating, for example, to form via conductors (221, 222) respectively. Wiring layer 211 and wiring layer 213 are electrically connected to each other by means of via conductor 221, and wiring layer 212 and wiring layer 214 are electrically connected to each other by means of via conductor 222.

Figure 3:
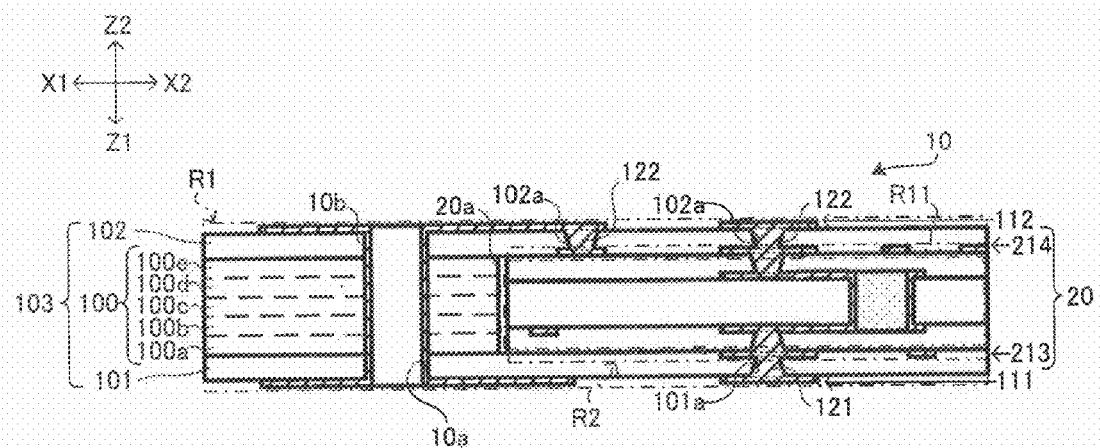
FIG. 3 is a cross-sectional view showing a schematic structure of a first rigid wiring board.

As shown in FIG. 3, first rigid wiring board 10 has built-in second rigid wiring board 20. In addition, first rigid wiring board 10 has insulative substrate 103 formed with substrate 100 and insulation layers (101, 102), wiring layers (111, 112) and via conductors (121, 122). Wiring layers (111, 112) are formed on the main surfaces (first surface, second surface) of first rigid wiring board 10.

Substrate 100 is formed with, for example, five-layer insulation layers, namely, insulation layers (100a-100e). Insulation layers (100a-100e) are laminated from the first surface toward the second surface in the order of insulation layers (100a), (100b), (100c), (100d) and (100e). The thickness of substrate 100 (the sum of the thicknesses of insulation layers (100a-100e)) is substantially the same as the thickness of second rigid wiring board 20. Also, via conductors (121, 122) are filled vias. The thickness of at least one wiring layer of second rigid wiring board 20 is preferred to be less than the thickness of a wiring layer in first rigid wiring board 10.

Figure 4:
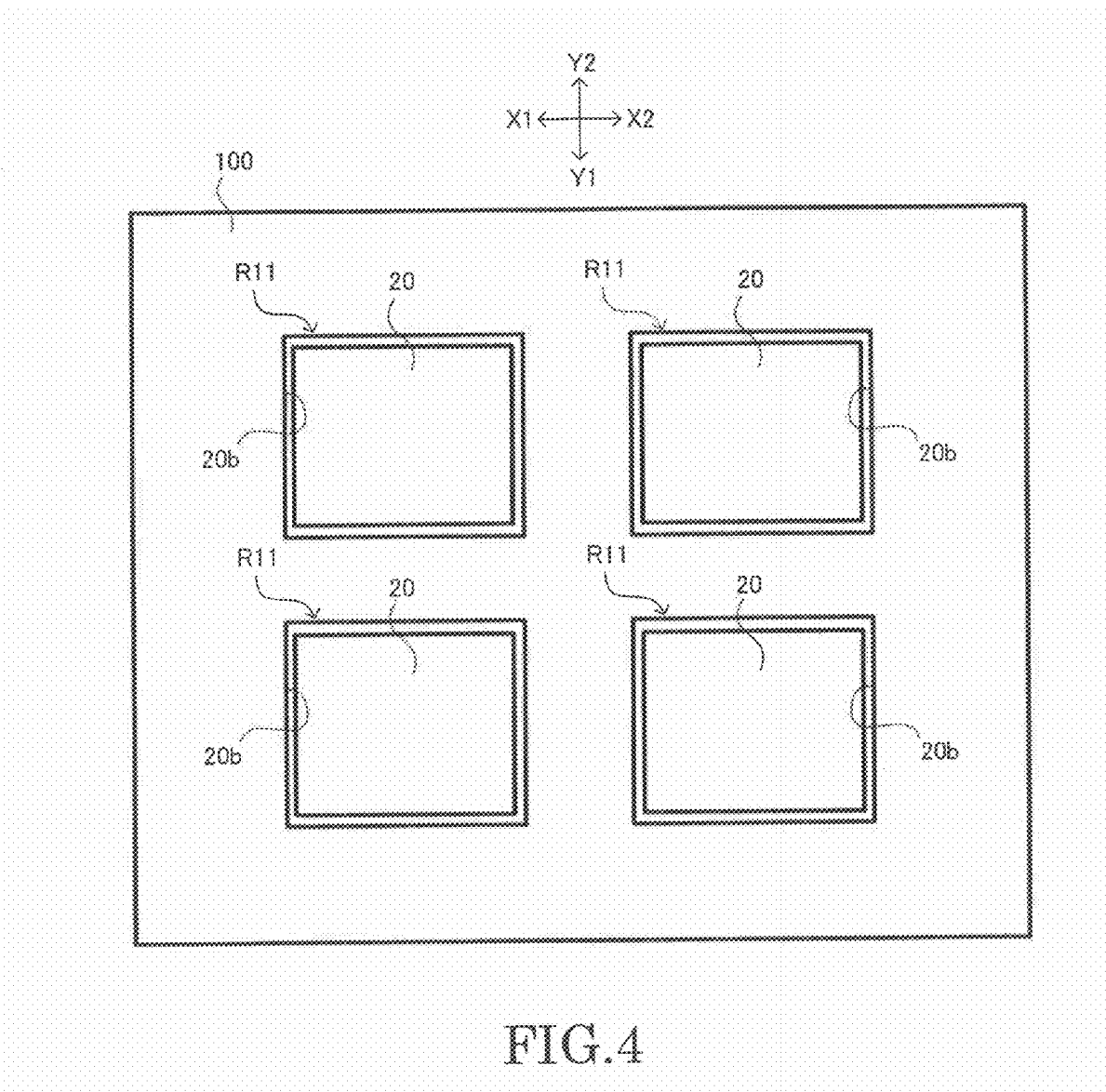
FIG. 4 is a plan view showing positions of second rigid wiring boards.

As shown in FIG. 4, penetrating holes (20b) are formed in substrate 100. Then, such penetrating holes (20b) become accommodation spaces (R11) (accommodation sections). As shown in FIG. 3, second rigid wiring board 20 is accommodated in accommodation space (R11) prepared in first rigid wiring board 10 (substrate 100).

In the clearances between first rigid wiring board 10 and second rigid wiring board 20, resin (20a) is filled, having been spilled out from the surrounding insulation layers (such as insulation layers (100a-100e) and insulation layers (101, 102)).

Substrate 100 and second rigid wiring boards 20 are positioned to be set along directions X or directions Y, as shown in FIG. 4. FIG. 4 shows an example in which multiple (such as four) rectangular accommodation spaces (R11) are formed in a single rectangular first rigid wiring board 10 (substrate 100), and then rectangular second rigid wiring board 20 is positioned in each accommodation space (R11). However, the present embodiment is not limited to such. The number, shape and so forth of first rigid wiring board 10 and second rigid wiring board 20 may be determined freely.

Insulation layers (100a-100e) are made of cured prepreg, for example. As for prepreg, the following is used, for example: base material such as glass fiber or aramid fiber impregnated with resin such as epoxy resin, polyester resin, bismaleimide triazine resin (BT resin), imide resin (polyimide), phenol resin or allyl polyphenylene ether resin (A-PPE resin).

Insulation layer 101 is formed on the first surface of second rigid wiring board 20 and of insulation layer (100a), and insulation layer 102 is formed on the second surface of second rigid wiring board 20 and of insulation layer (100e). Wiring layer 111 is formed on insulation layer 101, and wiring layer 112 is formed on insulation layer 102. Via hole (101a) is formed in insulation layer 101, and via hole (102a) is formed in insulation layer 102. In via holes (101a, 102a), a conductor (such as copper) is filled through plating, for example, to form via conductors (121, 122) respectively. Wiring layer 213 and wiring layer 111 are electrically connected to each other by means of via conductor 121. Also, wiring layer 214 and wiring layer 112 are electrically connected to each other by means of via conductor 122. Accordingly, lower-density conductive region (R1) and higher-density conductive region (R2) are electrically connected to each other by means of via conductors (121, 122).

Through hole (10a) is formed in substrate 100 and insulation layers (101, 102). Then, through-hole conductor (10b) is formed on the wall surface of through hole (10a). Through-hole conductor (10b) electrically connects wiring layer 111 and wiring layer 112 to each other.

In addition to above first rigid wiring board 10 (including second rigid wiring board 20), wiring board 1000 has insulation layers (301, 302), wiring layers (311, 312), via conductors (321, 322) and solder-resist layers (331, 332) as shown in FIG. 1. Via conductors (321, 322) are filled vias. Wiring board 1000 has a structure in which via conductors (221, 121, 321) are laminated in a direction Z on the first-surface side of substrate 200 and via conductors (222, 122, 322) are laminated in a direction Z on the second-surface side of substrate 200.

Insulation layer 301 is formed on the first surface of insulation layer 101, and insulation layer 302 is formed on the second surface of insulation layer 102. Resin (10c) spilled out from insulation layers (301, 302) is filled in through hole (10a).

Wiring layer 311 is formed on insulation layer 301, and wiring layer 312 is formed on insulation layer 302. Via hole (301a) is formed in insulation layer 301, and via hole (302a) is formed in insulation layer 302. In via holes (301a, 302a), a conductor (such as copper) is filled through plating, for example, to form via conductors (321, 322) respectively. Wiring layer 111 and wiring layer 311 are electrically connected to each other by means of via conductor 321. Also, wiring layer 112 and wiring layer 312 are electrically connected to each other by means of via conductor 322.

Solder-resist layer 331 is formed on the first surface of insulation layer 301, and solder-resist layer 332 is formed on the second surface of insulation layer 302. Solder-resist layers (331, 332) are each made of a resin such as photosensitive resins using acrylic-epoxy resins, thermosetting resins mainly containing epoxy resin, or UV-curable resins.

Opening (331a) is formed in solder-resist layer 331, and opening (332a) is formed in solder-resist layer 332. External connection terminal (331b) is formed in opening (331a), and external connection terminal (332b) is formed in opening (332a). External connection terminal (331b) is formed on wiring layer 311, and external connection terminal (332b) is formed on wiring layer 312. External connection terminals (331b, 332b) are solder bumps, for example. External connection terminals (331b, 332b) are used for electrical connection with other wiring boards and electronic components, for example. Wiring board 1000 may be used as a circuit board for a cell phone or the like by being mounted on other wiring boards using one or both of its surfaces, for example.

In wiring board 1000 of the present embodiment, second rigid wiring board 20 is accommodated in accommodation space (R11) of first rigid wiring board 10. Then, first rigid wiring board 10 and second rigid wiring board 20 are electrically connected to each other by means of via conductors (121, 122) in inner layers of wiring board 1000. Namely, in wiring board 1000, first rigid wiring board 10 and second rigid wiring board 20 are formed to be integrated in inner layers of wiring board 1000. Thus, the connection reliability between first rigid wiring board 10 and second rigid wiring board 20 is high against external impact or the like. As a result, cracks may be suppressed from occurring.

Since first rigid wiring board 10 and second rigid wiring board 20 are electrically connected to each other by means of via conductors (121, 122), during general manufacturing steps such as forming inner-layer patterns and forming via conductors for interlayer connections in wiring board 1000, first rigid wiring board 10 and second rigid wiring board 20 may be electrically connected. By sharing the manufacturing process, manufacturing costs and manufacturing time may be reduced. Also, separate methods (such as solder and adhesive agents) are not required for connecting first rigid wiring board 10 and second rigid wiring board 20.

Since first rigid wiring board 10 and second rigid wiring board 20 are electrically connected to each other in inner layers of wiring board 1000, the surfaces of wiring board 1000 become flat and seamless. As a result, component-mounting areas or wiring areas will be enlarged on the surfaces of wiring board 1000. In addition, since wiring distances are short compared with cases in which first rigid wiring board 10 and second rigid wiring board 20 are connected at their outermost layers, impedance may be reduced. Also, conductive material required for wiring may be less. Furthermore, impact from signal noise may be reduced.

In wiring board 1000 of the present embodiment, wiring layers (213, 214) on both main surfaces of second rigid wiring board 20 are electrically connected to wiring layers (111, 112) in first rigid wiring board 10 by means of inner-layer via conductors (121, 122) in wiring board 1000. Accordingly, the above effects (improvement in tolerance to impact and flatness features) may be achieved on both surfaces of wiring board 1000.

In addition, wiring layers and insulation layers are built up on both surfaces of first rigid wiring board 10 and second rigid wiring board 20. Accordingly, the symmetrical features (especially the symmetrical features in directions Z) of wiring board 1000 are enhanced and warping is suppressed in wiring board 1000.

Wiring board 1000 of the present embodiment partially has higher-density conductive region (R2), since first rigid wiring board 10 has built-in second rigid wiring board 20 with higher conductive density. Accordingly, it is easy to set wiring board 1000 to be partially fine-pitched.

In wiring board 1000 of the present embodiment, first rigid wiring board 10 and second rigid wiring board 20 are connected by resin (20a) spilled out from the surrounding insulation layers. Accordingly, adhesiveness is enhanced between first rigid wiring board 10 and second rigid wiring board 20. In addition, since resin (20a) becomes a buffer, when impact is exerted from outside, such impact will not be conveyed directly to second rigid wiring board 20. Therefore, tolerance to impact will increase in second rigid wiring board 20.

Via conductors (221, 121, 321) laminated in a direction Z will allow second rigid wiring board 20 to receive impact from the first-surface side. In addition, via conductors (222, 122, 322) laminated in a direction Z will allow second rigid wiring board 20 to receive impact from the second-surface side. Therefore, tolerance to impact will increase in second rigid wiring board 20.

In wiring board 1000 of the present embodiment, substrate 100 is formed with multiple (five layers) layers of prepreg (insulation layers (100a-100e)). Therefore, it is easy to adjust the thickness of substrate 100. Substrate 100 with an especially greater thickness may be formed easily.

Figure 5:
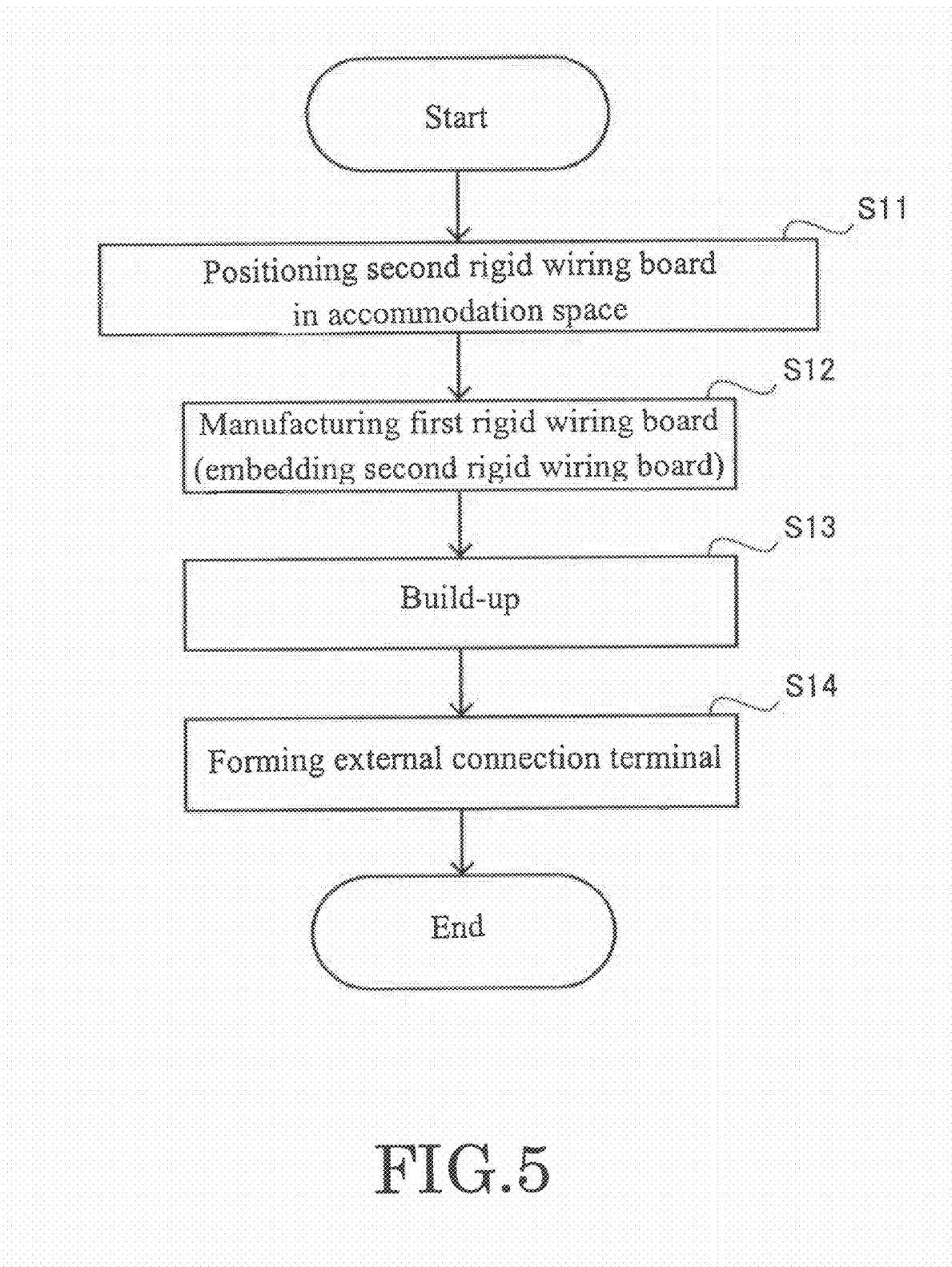
FIG. 5 is a flowchart showing the procedure of a method for manufacturing a wiring board relating to an embodiment of the present invention.

Wiring board 1000 is manufactured by a procedure shown in FIG. 5, for example.

Figure 6:
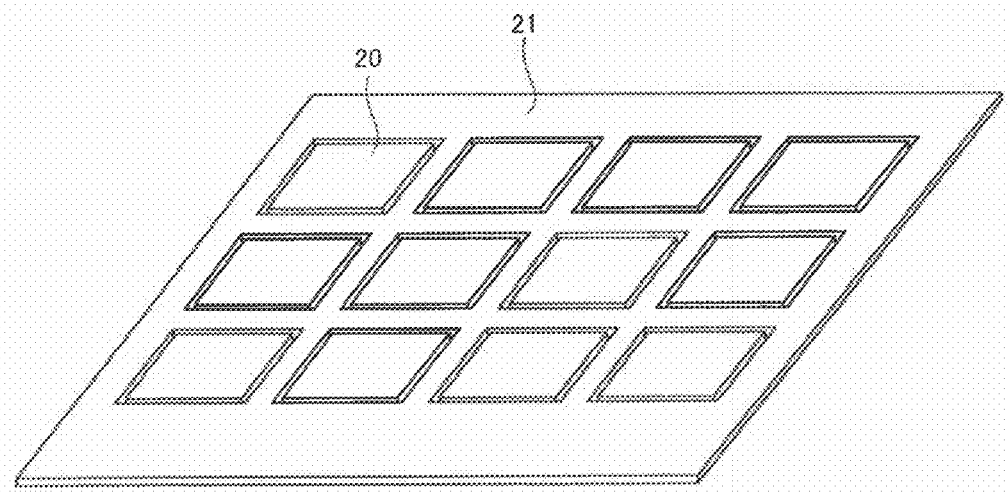
FIG. 6 is a view to illustrate a step for preparing second rigid wiring boards.
Figure 7:
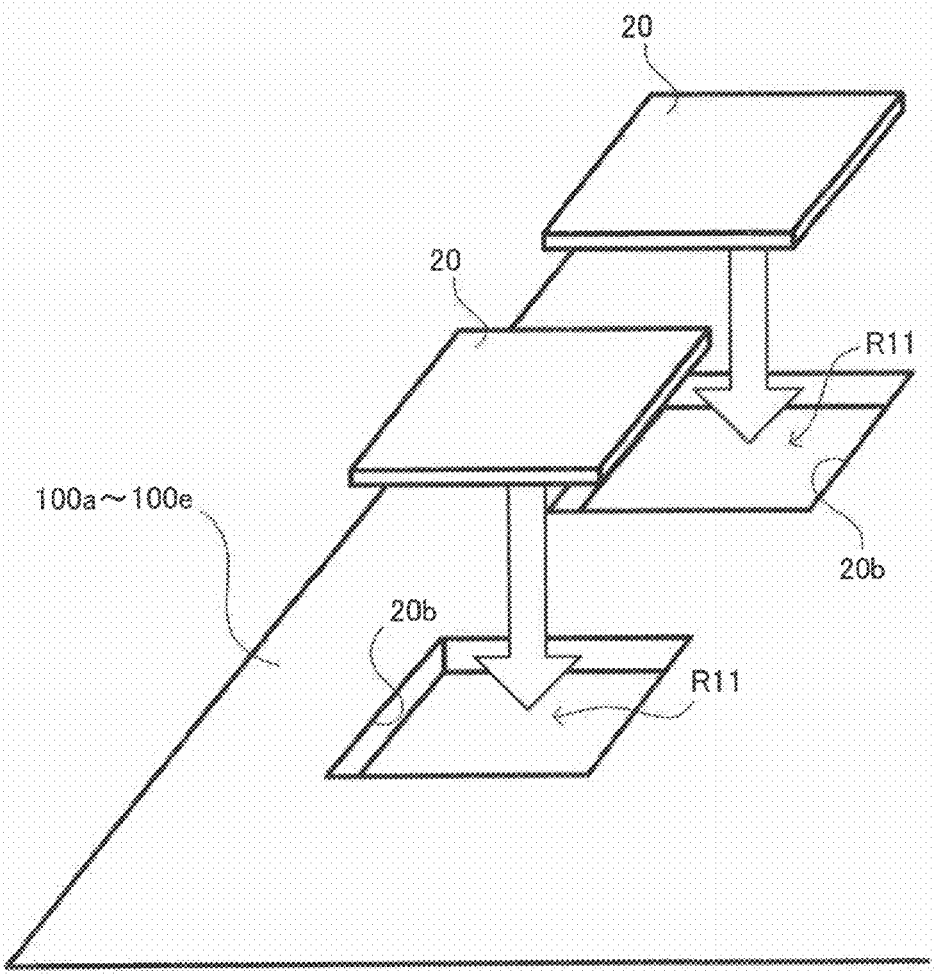
FIG. 7 is a view to illustrate a step for positioning second rigid wiring boards in accommodation spaces.

The following is prepared in step (S11): insulation layers (100a-100e) (substrate 100) having penetrating hole (20b) (FIG. 4); and second rigid wiring board 20 being cut out from multi-piece substrate 21, which contains multiple sheets (12 sheets) of wiring boards, for example, as shown in FIG. 6. As shown in FIG. 7, second rigid wiring board 20 is positioned in penetrating hole (20b) (accommodation space (R11)). Accommodation space (R11) is created by forming penetrating hole (20b) in insulation layers (100a-100e) by using a laser, for example. Since insulation layers (100a-100e) are separated from each other at this stage, accommodation space (R11) is formed in each of insulation layers (100a-100e). Insulation layers (100a-100e) are laminated by aligning accommodation spaces (R11). The size of accommodation space (R11) is preferred to be set substantially the same as, for example, the size of second rigid wiring board 20. For example, accommodation space (R11) is preferred to be made greater than second rigid wiring board 20 by a predetermined margin. In the meantime, second rigid wiring board 20 may be manufactured by a well-known build-up method.

In step (S12) of FIG. 5, first rigid wiring board 10 is manufactured. In doing so, second rigid wiring board 20 will be embedded in first rigid wiring board 10.

Figure 8:
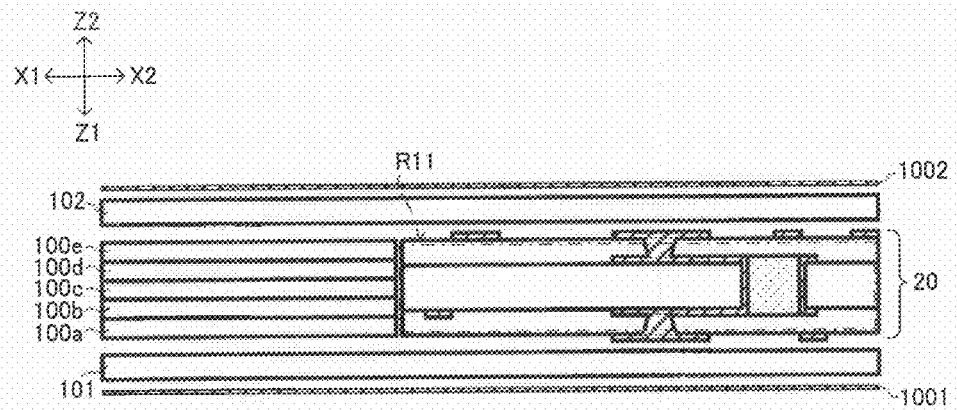
FIG. 8 is a view to illustrate a step for positioning insulation layers and copper foils when forming first layers.

More specifically, second rigid wiring board 20 is positioned in accommodation space (R11) through the process in above step (S11). From that stage, as shown in FIG. 8, insulation layer 101 and copper foil 1001 are further positioned on the first-surface side of insulation layer (100a) and second rigid wiring board 20, and insulation layer 102 and copper foil 1002 are positioned on the second-surface side of insulation layer (100e) and second rigid wiring board 20. At this stage, insulation layers (101, 102) (prepreg) are still uncured.

Figure 9:
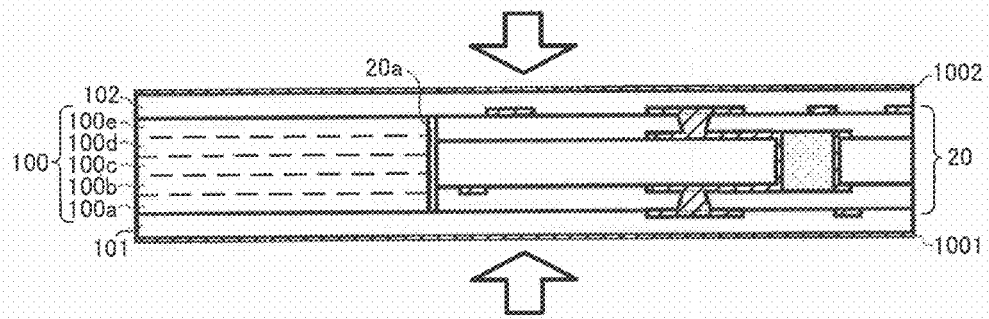
FIG. 9 is a view to illustrate a pressing step when forming first layers.

As shown in FIG. 9, pressure is exerted on outermost copper foils (1001, 1002). Such pressing is thermal pressing, for example. During such pressing, it is preferred that the members (pressing targets) as positioned above be sandwiched by a pressing device aligned by pins, for example, and that pressure be exerted substantially perpendicular to the main surfaces.

In doing so, openings on both ends of penetrating hole (20b) (FIG. 7) are covered by insulation layer 101 formed on the first-surface side and insulation layer 102 formed on the second-surface side. In addition, resin (20a) is spilled out from the prepreg forming each of insulation layers (100a-100e) and insulation layers (101, 102). Resin (20a) is filled in clearances between insulation layers (100a-100e) and second rigid wiring board 20. Through pressing and heating, each prepreg is cured and the members become adhered to each other. Insulation layers (100a-100e) are integrated and become substrate 100. Pressing and heating treatments may be divided into multiple procedures. Also, heating and pressing treatments may be conducted separately.

Figure 10:
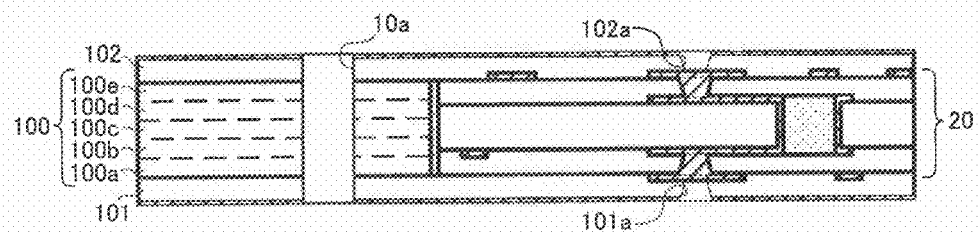
FIG. 10 is regarding first layers, a view to illustrate a step for forming via holes and through holes.

As shown in FIG. 10, by irradiating a $CO_2$ laser, for example, via holes (101a, 102a) and through hole (10a) are formed. Desmearing and soft etching are conducted if required.

Plated film is formed on the entire first surface and second surface by panel plating (such as chemical copper plating or copper electroplating). Such plated film is patterned by a predetermined lithographic procedure (for example, preliminary treatment, lamination, exposure to light, development, etching, film removal and so forth). Accordingly, first rigid wiring board 10 is manufactured as shown previously in FIG. 3. Namely, through such plating, via conductor 121 is formed in via hole (101a), via conductor 122 is formed in via hole (102a), and through-hole conductor (10b) is formed on the wall surface of through hole (10a). In addition, wiring layer 111 is formed on the first surface of insulation layer 101, and wiring layer 112 is formed on the second surface of insulation layer 102. Roughened surfaces are formed if required.

In step (S13) of FIG. 5, wiring layers and insulation layers are built up on both surfaces of first rigid wiring board 10.

Figure 11:
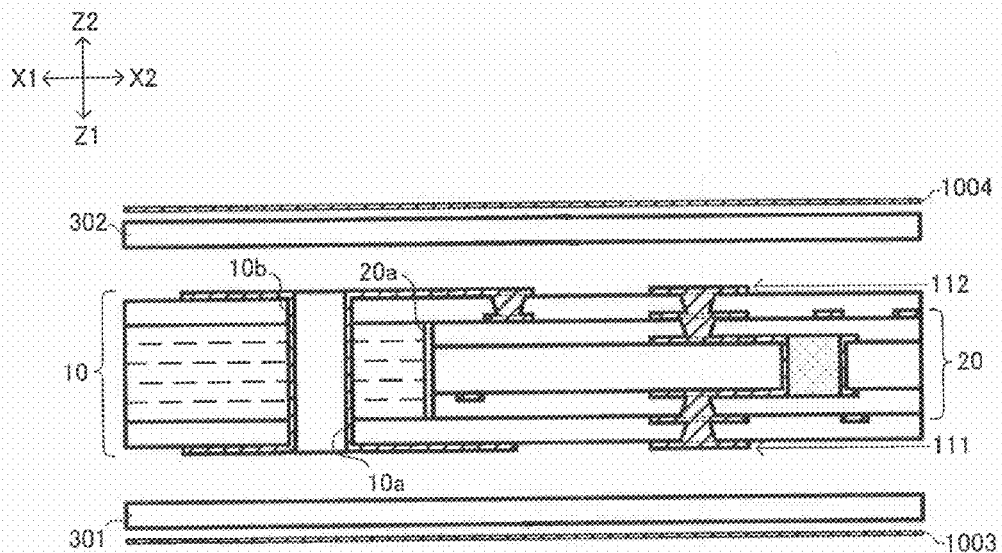
FIG. 11 is a view to illustrate a step for positioning insulation layers and copper foils when forming second layers.

More specifically, as shown in FIG. 11, insulation layer 301 and copper foil 1003 are positioned on the first-surface side of first rigid wiring board 10, and insulation layer 302 and copper foil 1004 are positioned on the second-surface side of first rigid wiring board 10. At this stage, insulation layers (301, 302) (prepreg) are still uncured.

Figure 12:
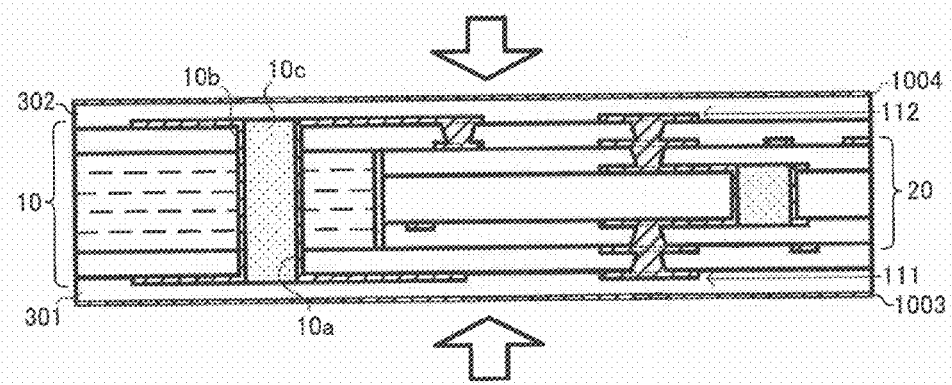
FIG. 12 is a view to illustrate a pressing step when forming second layers.

As shown in FIG. 12, pressure is exerted on outermost copper foils (1003, 1004), the same as in the step in FIG. 9. Accordingly, resin (10c) is spilled out from the prepreg forming each of insulation layers (301, 302). Resin (10c) is filled in through hole (10a). Through pressing and heating, each prepreg is cured and the members will be adhered to each other.

Figure 13:
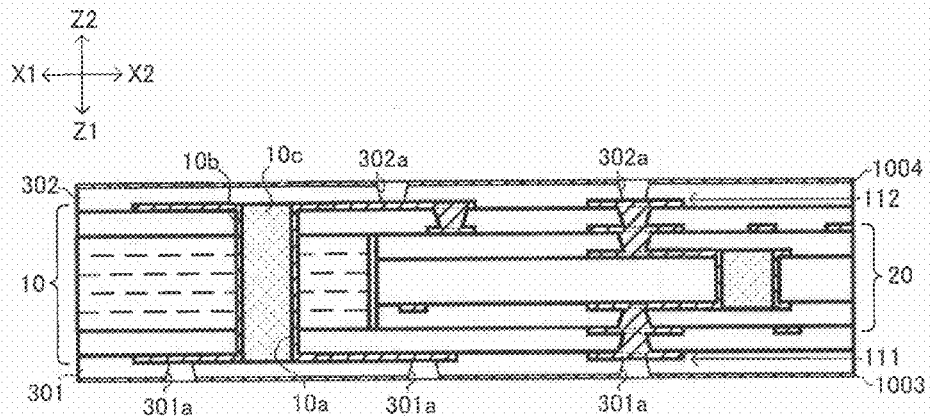
FIG. 13 is regarding second layers, a view to illustrate a step for forming via holes.

As shown in FIG. 13, by irradiating a $CO_2$ laser, for example, via holes (301a, 302a) are formed. Desmearing and soft etching are conducted if required.

Figure 14:
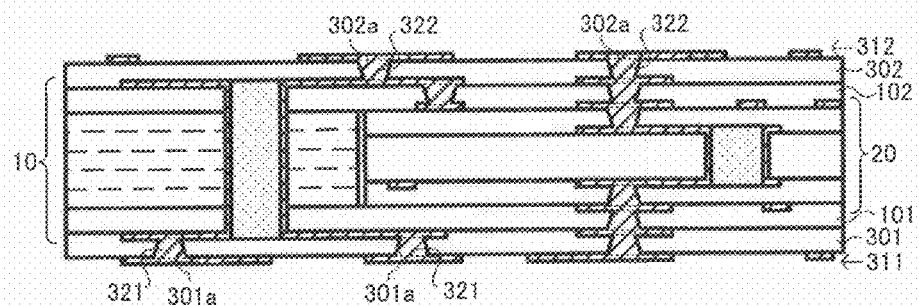
FIG. 14 is regarding second layers, a view to illustrate a plating step and a patterning step.

Plated film is formed on the entire first surface and second surface by panel plating (such as chemical copper plating or copper electroplating). As shown in FIG. 14, such plated film is patterned by a predetermined lithographic procedure. Through such plating, via conductor 321 is formed in via hole (301a), and via conductor 322 is formed in via hole (302a). Also, wiring layer 311 is formed on the first surface of insulation layer 301, and wiring layer 312 is formed on the second surface of insulation layer 302. Surfaces are roughened if required.

In step (S14) of FIG. 5, external connection terminals are formed on outermost layers.

Figure 15:
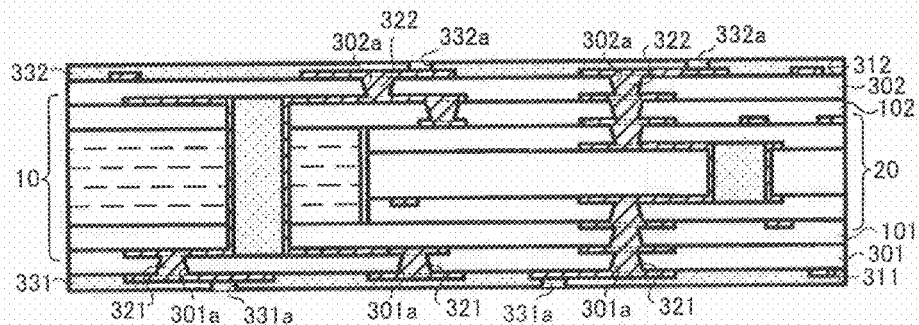
FIG. 15 is a view to illustrate a step for forming solder-resist layers.

More specifically, after solder-resist layers (331, 332) are formed through application or lamination, as shown in FIG. 15, openings (331*a*, 332*a*) are formed in solder-resist layers (331, 332) through a predetermined lithographic procedure. Through openings (331*a*, 332*a*), parts of wiring layers (311, 312) are exposed as pads. Surface treatments, such as Ni/Au plating or OSP (Organic Solderability Preservative), are conducted on such pads if required. In the present embodiment, openings (331*a*, 332*a*) are formed after solder-resist layers (331, 332) are formed, but the present invention is not limited to such. For example, solder-resist layers (331, 332) may be selectively formed by positioning in advance a mask material in areas for openings (331*a*, 332*a*) so that solder-resist layers (331, 332) may be formed to have openings (331*a*, 332*a*) from the initial stage.

By printing solder paste and reflowing, external connection terminals (331*b*, 332*b*) (solder bumps) are formed in openings (331*a*, 332*a*). External connection terminals (331*b*, 332*b*) are positioned on pads. Accordingly, wiring board 1000 (FIG. 1) is completed. Also, external processing, warping correction, conductivity inspection, exterior inspection or final inspection is conducted according to requirements.

The manufacturing method according to the present embodiment is suitable for manufacturing wiring board 1000. Using such a manufacturing method, an excellent wiring board 1000 may be obtained at low cost.

So far, a wiring board and its manufacturing method according to an embodiment of the present invention have been described. However, the present invention is not limited to the above embodiment. For example, the present invention may be carried out by being modified as follows.

In the above embodiment, due to the difference in the numbers of wiring layers, the existing density of conductors in higher-density conductive region (R2) is set greater than the existing density of conductors in lower-density conductive region (R1). However, the present invention is not limited to such. For example, due to the difference in the numbers of via conductors, or due to the difference in the line widths and pitches of conductive patterns, the existing density of conductors in higher-density conductive region (R2) may be set greater than the existing density of conductors in lower-density conductive region (R1).

Via conductors (121, 122, 221, 222, 321, 322) may be conformal vias instead of filled vias. However, in order to enhance tolerance to impact, filled vias are preferred. In addition, since filled vias may be formed by laminating them, filled vias are preferred in order to increase flexibility of design.

Figure 16:
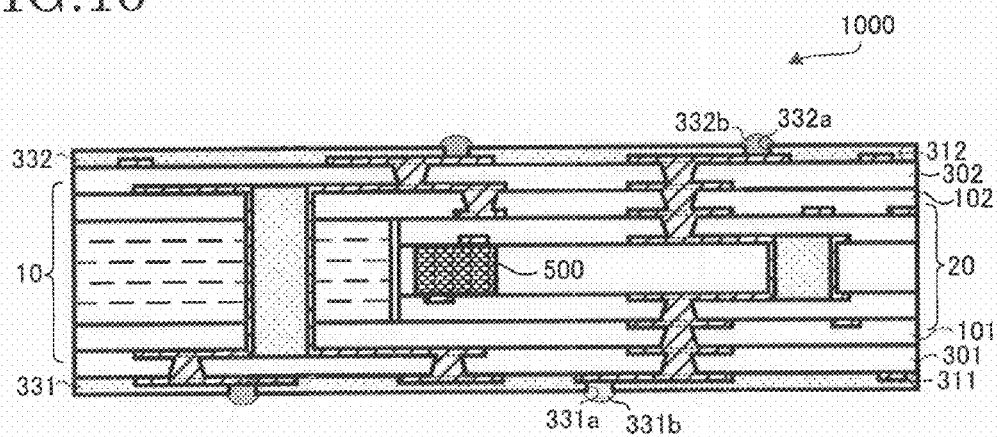
FIG. 16 is a view showing an example of a second rigid wiring board with a built-in electronic component.

As shown in FIG. 16, second rigid wiring board 20 may have built-in electronic component 500. Second rigid wiring board 20 may have multiple built-in electronic components.

Figure 17:
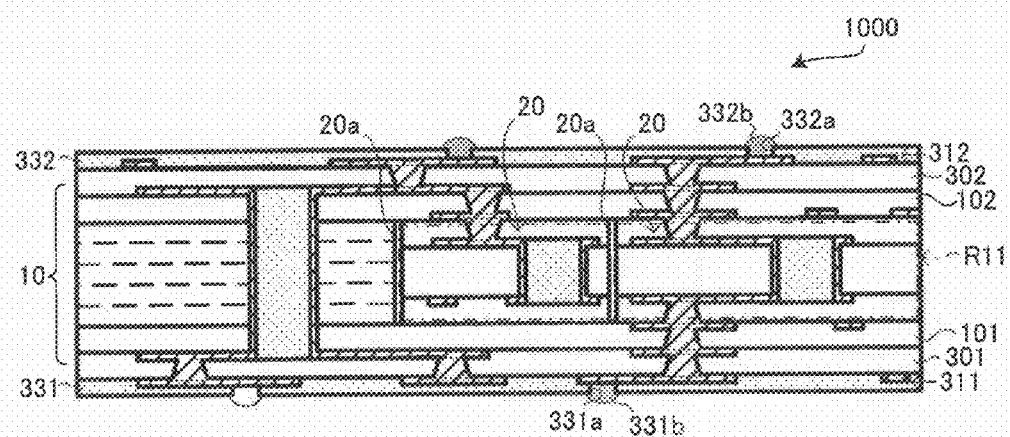
FIG. 17 is a view showing an example of a wiring board with multiple built-in second rigid wiring boards.

As shown in FIG. 17, multiple second rigid wiring boards 20 may be built into single accommodation space (R11) in first rigid wiring board 10.

In the above embodiment, resin spilled out from the upper-layer insulation layers is filled in the clearances between substrate 100 and second rigid wiring board 20. However, the present invention is not limited to such. For example, resin or the like prepared separately may be filled in such clearances before forming upper-layer insulation layers. In such a case, it is effective to use a dispenser or the like when injecting (filling) resin. Alternatively, second rigid wiring board 20 may be preliminarily secured using an adhesive agent before upper-layer insulation layers are formed.

Conductive patterns in wiring board 1000 may be formed to fan out from component connection terminals (such as external connection terminals (331*b*)) toward board connection terminals (such as external connection terminals (332*b*)).

Figure 18:
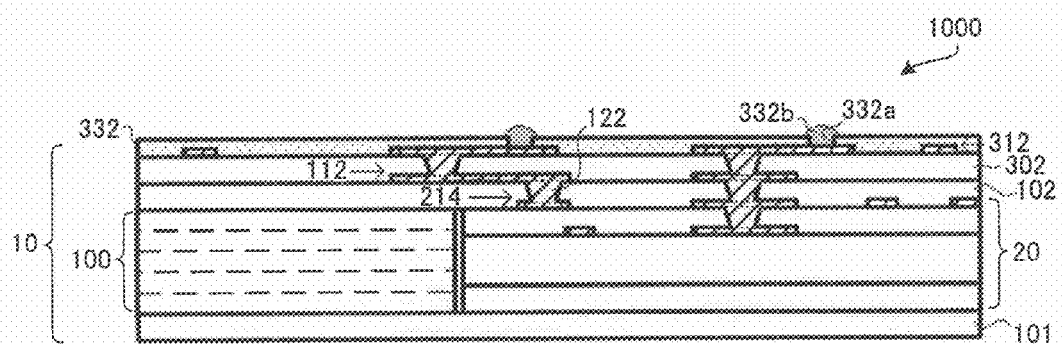
FIG. 18 is a view showing an example in which a first rigid wiring board and a second rigid wiring board respectively have wiring layers only on one surface.

As shown in FIG. 18, first rigid wiring board 10 and second rigid wiring board 20 may respectively have wiring layers only on one surface.

As shown in FIG. 18, only wiring layer 214 on one main surface of second rigid wiring board 20 may be electrically connected to wiring layer 112 of first rigid wiring board 10 by means of via conductor 122 in an inner layer of wiring board 1000.

In cases such as that shown in FIG. 18 where wiring board 1000 and first rigid wiring board 10 cannot be distinguished and are practically equivalent to each other, since first rigid wiring board 10 and second rigid wiring board 20 are electrically connected to each other by means of via conductor 122 in an inner layer of wiring board 1000, connection reliability between first rigid wiring board 10 and second wiring board 20 is high against external impact or the like.

The shape and the size of accommodation space (R11) are not limited specifically. However, the shape and the size corresponding to those of second rigid wiring board 20 are preferred to align second rigid wiring board 20.

Figure 19:
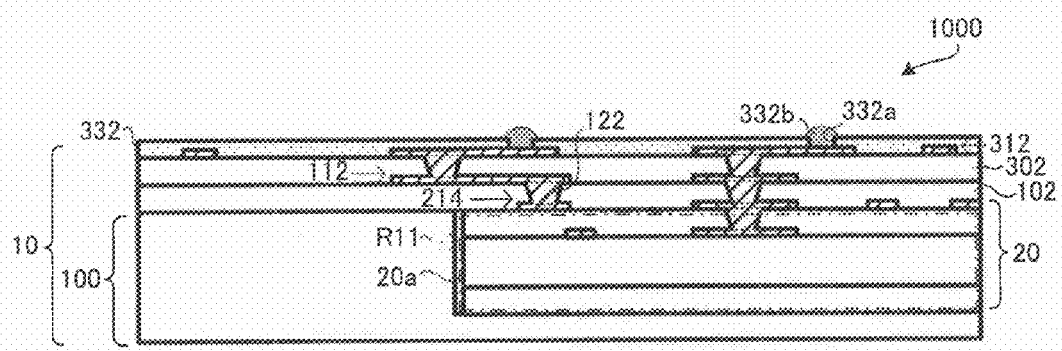
FIG. 19 is a view showing an example in which an accommodation space is a recessed section.

Accommodation space (R11) is not limited to a penetrating hole. For example, as shown in FIG. 19, accommodation space (R11) may be a recessed section.

In the above embodiment, substrate 100 is formed with five-layer prepreg layers (insulation layers (100*a*-100*e*)). However, the present invention is not limited to such. For example, as shown in FIG. 19, substrate 100 may be a single-layer substrate (such as epoxy resin).

Regarding other elements in the above embodiment, the position, shape, material, size, pattern or the number of layers of each element may be modified freely within a scope that does not deviate from the gist of the present invention.

Forming accommodation space (R11) is not limited to any specific method. For example, accommodation space (R11) may be formed by etching or the like.

The manufacturing method of the present invention is not limited to the contents and order shown in the flowchart of FIG. 5. The contents and order may be modified within a scope that does not deviate from the gist of the present invention. Also, some steps may be omitted according to usage requirements or the like.

For example, in the above embodiment, wiring board 1000 was manufactured by the procedure shown in FIG. 5. However, manufacturing wiring board 1000 is not limited to such, and various other methods may be employed. In the following, as leading examples, manufacturing methods using a semi-additive method and a transfer method will be described. Equivalent numerical references are used for the elements the same as or equivalent to those in the above embodiment, and their descriptions will be omitted or simplified.

Figure 20:
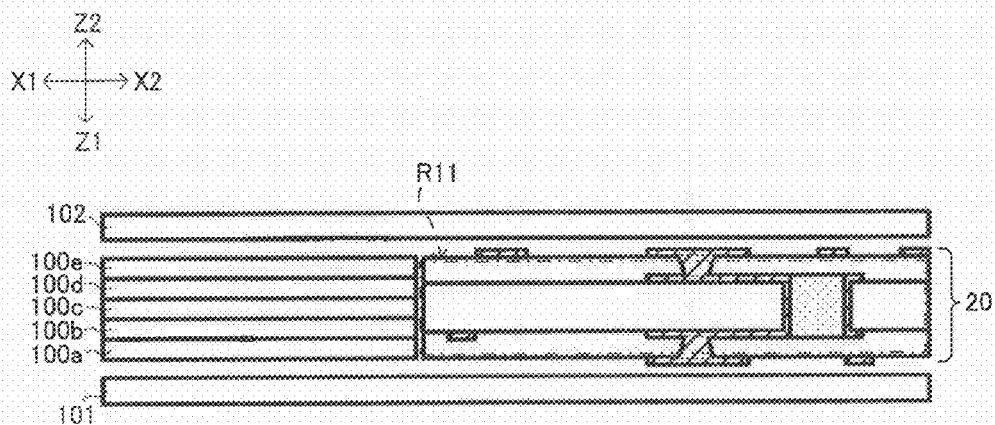
FIG. 20 is a view to illustrate a manufacturing method using a semi-additive method (step 1)

In the following, a process of manufacturing a printed circuit board using a semi-additive method according to an embodiment of the present invention is explained. When manufacturing using a semi-additive method, as shown in FIG. 20, insulation layer 101 is positioned on the first-surface side of insulation layer (100*a*) and of second rigid wiring board 20, and insulation layer 102 is positioned on the second-surface side of insulation layer (100*e*) and of second rigid wiring board 20.

Figure 21:
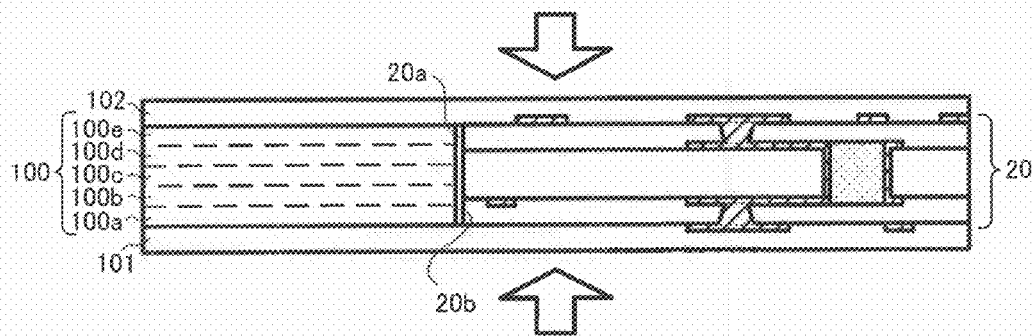
FIG. 21 is a view to illustrate a manufacturing method using a semi-additive method (step 2)

Thermal pressing is conducted to exert forces in the directions indicated by arrows shown in FIG. 21. Accordingly, insulation layers (100a-100e) will be integrated and become substrate 100.

Figure 22:
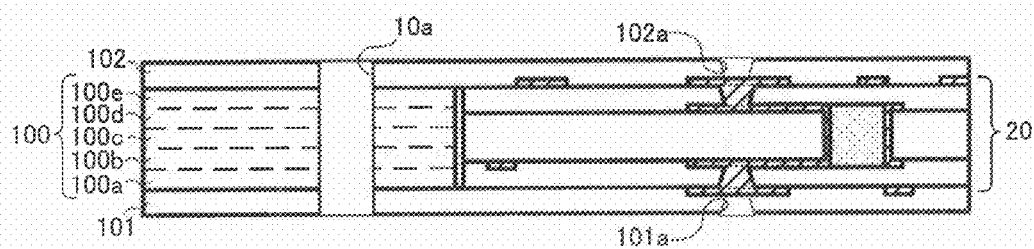
FIG. 22 is a view to illustrate a manufacturing method using a semi-additive method (step 3)

By irradiating a $CO_2$ laser, for example, via holes (101a, 102a) and through hole (10a) are formed as shown in FIG. 22. Desmearing and soft etching are conducted if required.

Figure 23:
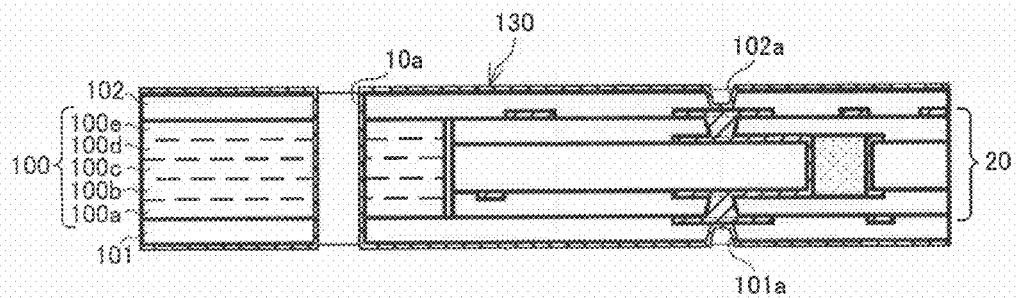
FIG. 23 is a view to illustrate a manufacturing method using a semi-additive method (step 4)

As shown in FIG. 23, by performing electroless copper plating on the first surface and second surface of insulation layers (101, 102), plated film 130 is formed on insulation layers (101, 102).

Figure 24:
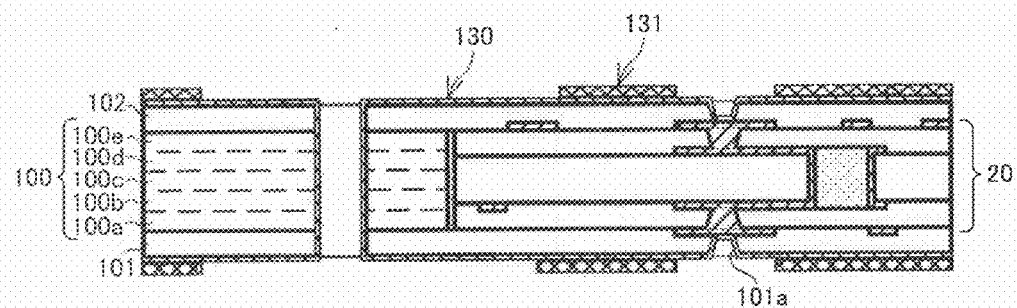
FIG. 24 is a view to illustrate a manufacturing method using a semi-additive method (step 5)

As shown in FIG. 24, patterned plating resist 131 is formed on plated film 130 formed on insulation layers (101, 102).

Figure 25:
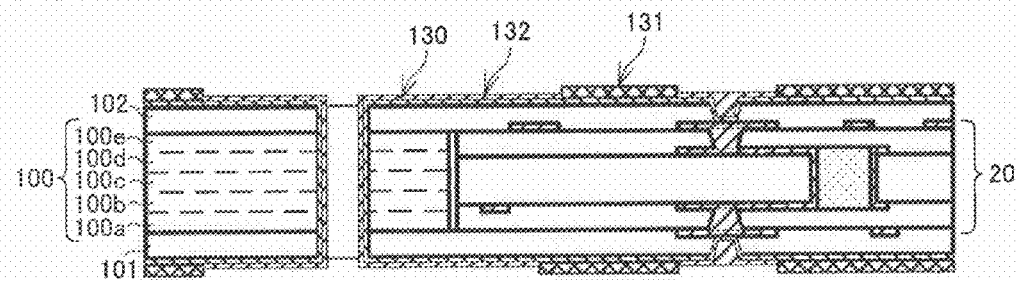
FIG. 25 is a view to illustrate a manufacturing method using a semi-additive method (step 6)

As shown in FIG. 25, by performing electrolytic copper plating on plated film 130 having plating resist 131, plated film 132 is formed to coat plated film 130.

Figure 26:
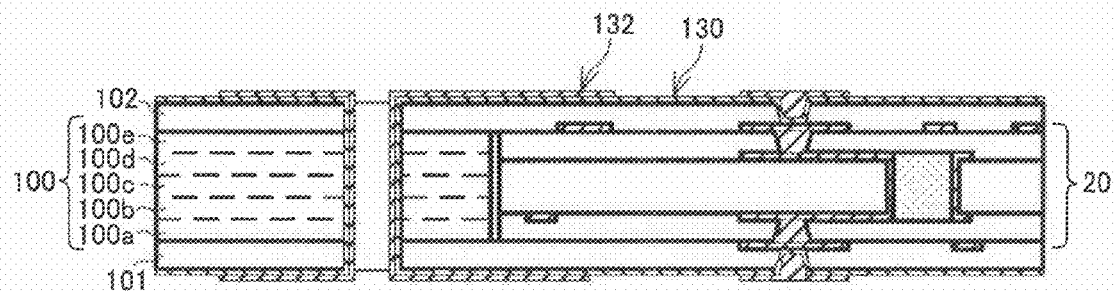
FIG. 26 is a view to illustrate a manufacturing method using a semi-additive method (step 7)
Figure 27:
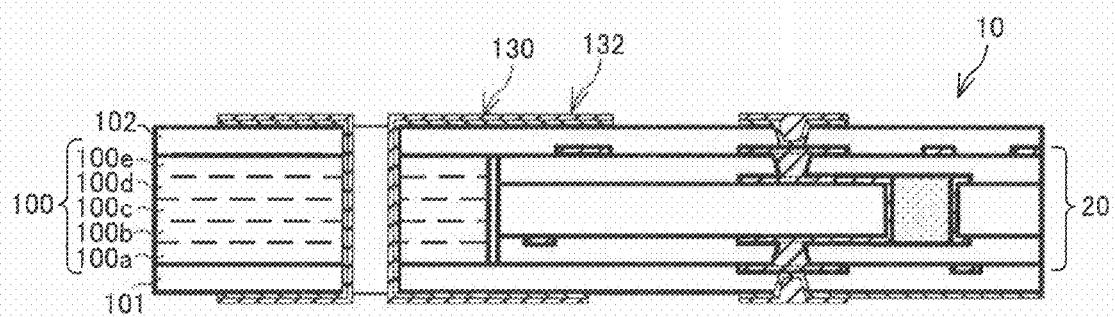
FIG. 27 is a view to illustrate a manufacturing method using a semi-additive method (step 8)

As shown in FIG. 26, after plating resist 131 is removed (peeled), etching treatment is conducted. Accordingly, exposed plated film 130 is removed, and first rigid wiring board 10 with built-in second wiring board 20 is completed as shown in FIG. 27.

Through the procedure described in the above embodiment, insulation layers (301, 302) and wiring layers (311, 312) are formed on the first-surface side and second-surface side of first rigid wiring board 10. Accordingly, wiring board 1000 is completed as shown in FIG. 1.

Figure 28:
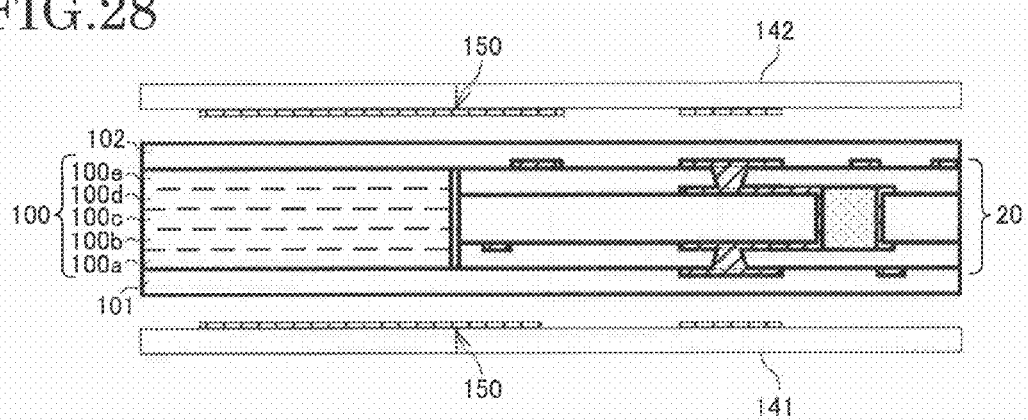
FIG. 28 is a view to illustrate a manufacturing method using a transfer method (step 1)

In the following, a process of manufacturing a printed circuit board using a transfer method according to an embodiment of the present invention is explained. When manufacturing using a transfer method, after insulation layers (100a-100e) are integrated by thermal pressing, as shown in FIG. 28, a pair of stainless-steel boards (141, 142) are prepared where conductive pattern 150 is formed on the surfaces by electrolytic copper plating. Then, the surfaces with conductive pattern 150 are positioned to face insulation layers (101, 102) respectively.

Figure 29:
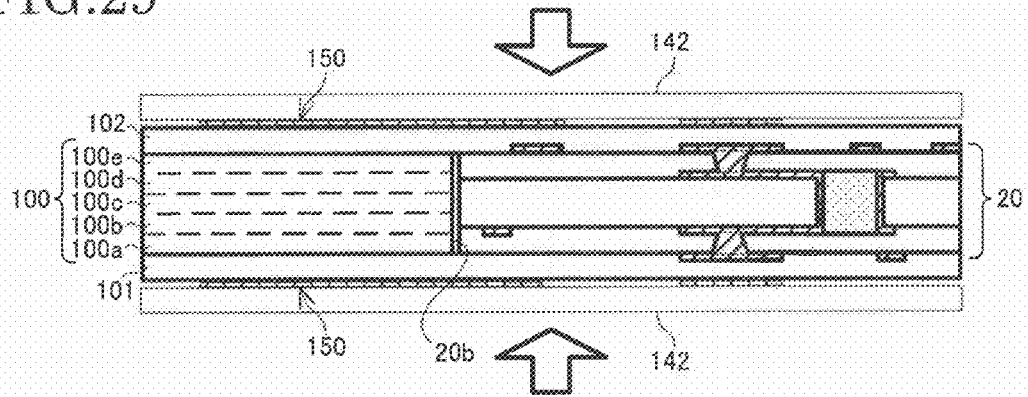
FIG. 29 is a view to illustrate a manufacturing method using a transfer method (step 2)

Pressing is conducted to exert force in the directions indicated by arrows shown in FIG. 29. Accordingly, conductive pattern 150 will be transferred to insulation layers (101, 102).

Figure 30:
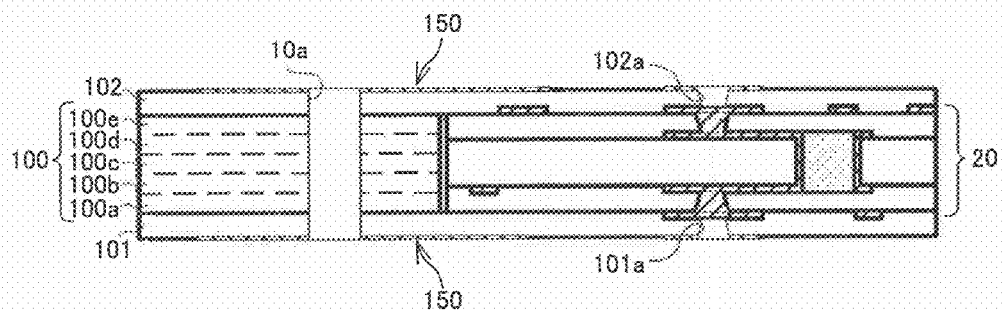
FIG. 30 is a view to illustrate a manufacturing method using a transfer method (step 3)

By irradiating a $CO_2$ laser, for example, via holes (101a, 102a) and through hole (10a) are formed as shown in FIG. 30. Desmearing and soft etching are conducted if required.

Figure 31:
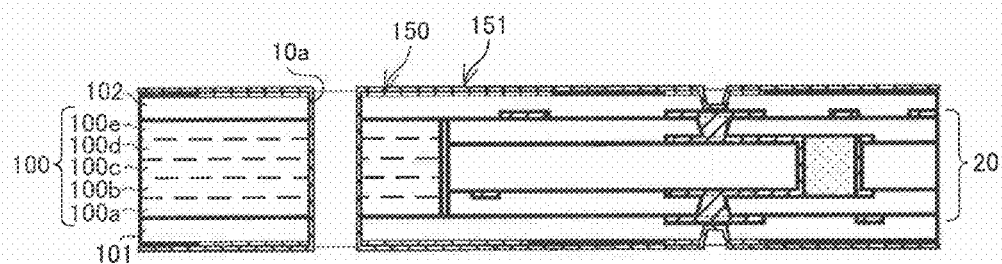
FIG. 31 is a view to illustrate a manufacturing method using a transfer method (step 4)

As shown in FIG. 31, by performing electroless copper plating on the first surface and second surface of insulation layers (101, 102), plated film 151 is formed on insulation layers (101, 102).

Figure 32:
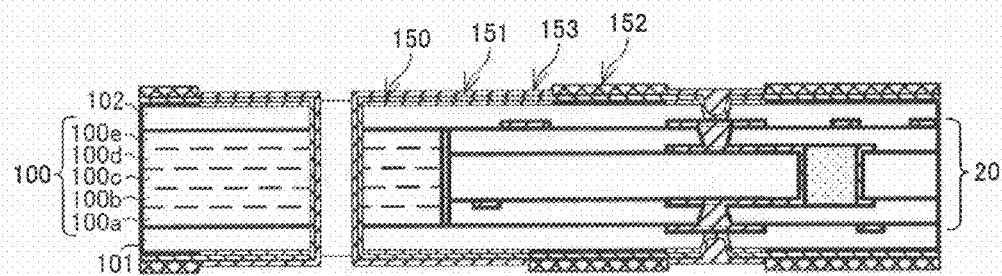
FIG. 32 is a view to illustrate a manufacturing method using a transfer method (step 5)

As shown in FIG. 32, patterned plating resist 152 is formed on plated film 151 formed on insulation layers (101, 102). Then, electrolytic copper plating is performed on plated film 151 with plating resist 152 to form plated film 153.

Figure 33:
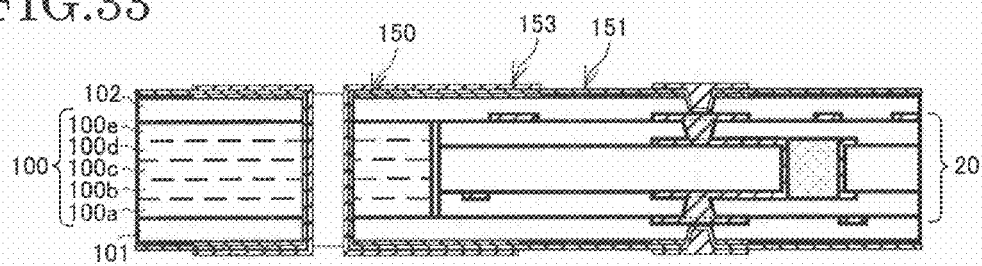
FIG. 33 is a view to illustrate a manufacturing method using a transfer method (step 6)
Figure 34:
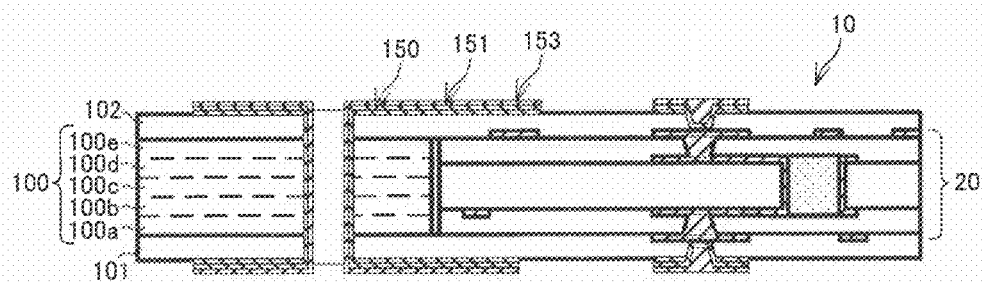
FIG. 34 is a view to illustrate a manufacturing method using a transfer method (step 7)

As shown in FIG. 33, after plating resist 152 is removed (peeled), etching treatment is conducted. In doing so, exposed plated film 151 is removed and first rigid wiring board 10 with built-in second rigid wiring board 20 is completed as shown in FIG. 34.

Through the procedure described in the above embodiment, insulation layers (301, 302) and wiring layers (311, 312) are formed on the first-surface side and second-surface side of first rigid wiring board 10. Accordingly, wiring board 1000 is completed as shown in FIG. 1.

In the above embodiment, first wiring layer 112 and second wiring layer 214 are connected by via conductor 122, and third wiring layer 111 and fourth wiring layer 213 are connected by via conductor 121. However, the present invention is not limited to such. First wiring layer 112 and second wiring layer 214 or third wiring layer 111 and fourth wiring layer 213 may be connected by a through-hole conductor.

Figure 35:
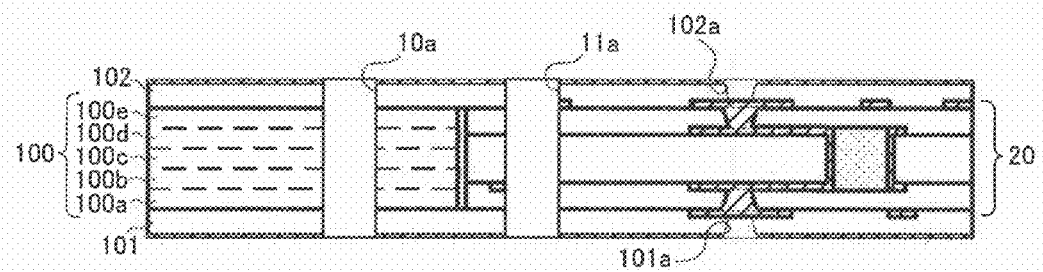
FIG. 35 is a view to illustrate a wiring board in which wiring layers are connected by a through-hole conductor (step 1)

For example, as shown in FIG. 35, after substrate 100 is formed by conducting pressing treatment, via holes (101a, 102a) and through holes (10a, 11a) are formed by irradiating a $CO_2$ laser, for example. Desmearing and soft etching are conducted if required.

Figure 36:
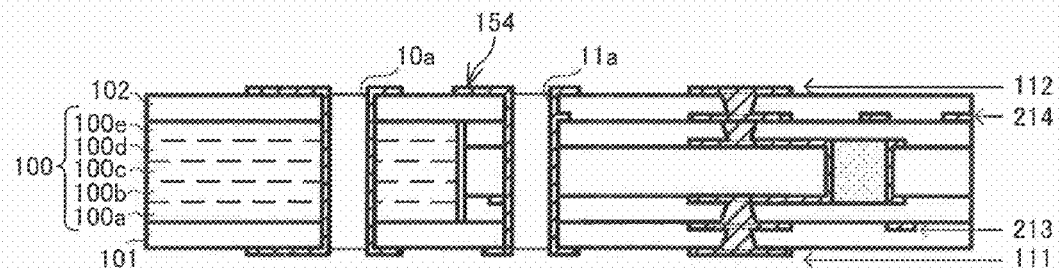
FIG. 36 is a view to illustrate a wiring board in which wiring layers are connected by a through-hole conductor (step 2).

Plated film 154 is formed on the entire first and second surfaces by panel plating, and such plated film is patterned by a predetermined lithographic procedure (for example, preliminary treatment, lamination, exposure to light, development, etching, film removal and so forth). Accordingly, first rigid wiring board 10 is manufactured as shown in FIG. 36.

In such first rigid wiring board 10, first wiring layer 112 and second wiring layer 214 along with third wiring layer 111 and fourth wiring layer 213 are electrically connected by plated film 154 (through-hole conductor) formed inside through hole (11a).

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a first rigid wiring board comprising a substrate having a penetrating hole, a first insulation layer formed on the substrate and covering an opening of the penetrating hole, and a first wiring layer formed on the first insulation layer;
   a second rigid wiring board accommodated in the penetrating hole, the second rigid wiring board comprising a second wiring layer on a surface of the second rigid wiring board and a fourth wiring layer on a surface opposite the surface on which the second wiring layer is formed;
   a first connection conductor connecting the first wiring layer and the second wiring layer; and
   a first interlayer insulation layer formed on the first wiring layer,
   wherein the second rigid wiring board comprises a second substrate and an inner wiring layer formed on the second substrate, and the second wiring layer and the fourth wiring layer are electrically connected to each other through the inner wiring layer formed on the second substrate;
   wherein the first rigid wiring board has a second insulation layer formed on the substrate to cover the other opening of the penetrating hole, and a third wiring layer formed on the second insulation layer; and the wiring board further comprises a second connection conductor which connects the third wiring layer and the fourth wiring layer, and a second interlayer insulation layer formed on the third wiring layer.

2. The wiring board according to claim 1, wherein the first insulation layer is made of a prepreg, and a resin spilled out from the first insulation layer is filled in a clearance between the first rigid wiring board and the second rigid wiring board.

3. The wiring board according to claim 1, wherein an existing density of conductors in the second rigid wiring board is higher than an existing density of conductors in the first rigid wiring board.

4. The wiring board according to claim 1, wherein the second rigid wiring board is a multilayer wiring board comprising a plurality of wiring layers including the second wiring layer, and a total number of wiring layers in the second rigid wiring board is greater than a total number of wiring layers, including the first wiring layer, in the first rigid wiring board.

5. The wiring board according to claim 1, wherein the second rigid wiring board is a multilayer wiring board comprising a plurality of wiring layers including the second wiring layer, and a thickness of at least one wiring layer in the second rigid wiring board is less than a thickness of a wiring layer in the first rigid wiring board.

6. The wiring board according to claim 1, wherein the first connection conductor is a via conductor formed in the first insulation layer.

7. The wiring board according to claim 6, wherein the first connection conductor is a filled via.

8. The wiring board according to claim 1, wherein the first connection conductor is a through-hole conductor that penetrates through the second rigid wiring board and the first insulation layer.

9. The wiring board according to claim 1, wherein the first rigid wiring board and the second rigid wiring board comprise a resin.

* * * * *